United States Patent
Brown et al.

[11] Patent Number: 6,144,086
[45] Date of Patent: Nov. 7, 2000

[54] STRUCTURE FOR IMPROVED LATCH-UP USING DUAL DEPTH STI WITH IMPURITY IMPLANT

[75] Inventors: Jeffrey Scott Brown, Middlesex; Robert J. Gauthier, Jr., Hinesburg; Randy William Mann, Jericho; Steven Howard Voldman, South Burlington, all of Vt.

[73] Assignee: International Business Machines Corporation, Armonk, N.Y.

[21] Appl. No.: 09/303,156

[22] Filed: Apr. 30, 1999

[51] Int. Cl.[7] ................................................. H01L 29/00
[52] U.S. Cl. ........................... 257/510; 257/513; 257/514; 257/515; 438/221; 438/224
[58] Field of Search ..................... 257/622, 499, 257/528, 544, 548, 510, 511, 513, 514, 515; 438/369, 421, 221, 224, 296, 424, 426, 427, 510, 511, 513, 514

[56] References Cited

U.S. PATENT DOCUMENTS

| | | | |
|---|---|---|---|
| 4,578,128 | 3/1986 | Mundt et al. | 148/191 |
| 4,593,459 | 6/1986 | Poppert et al. | 29/577 |
| 4,683,488 | 7/1987 | Lee et al. | 357/42 |
| 4,835,115 | 5/1989 | Eklund | 437/38 |
| 4,931,409 | 6/1990 | Nakajima et al. | 437/63 |
| 5,292,671 | 3/1994 | Odanaka | 437/29 |
| 5,298,450 | 3/1994 | Verret | 437/67 |
| 5,342,480 | 8/1994 | Nishizawa et al. | 156/648 |
| 5,358,891 | 10/1994 | Tsang et al. | 437/67 |
| 5,436,495 | 7/1995 | Sakamoto | 257/506 |
| 5,465,003 | 11/1995 | Lur et al. | 257/510 |
| 5,525,532 | 6/1996 | Kim | 437/56 |
| 5,534,450 | 7/1996 | Kim | 437/34 |
| 5,536,675 | 7/1996 | Bohr | 437/67 |
| 5,573,969 | 11/1996 | Kim | 437/57 |
| 5,616,513 | 4/1997 | Shepard | 438/402 |
| 5,627,097 | 5/1997 | Venkatesan et al. | 438/217 |
| 5,654,570 | 8/1997 | Agnello | 257/338 |
| 5,686,344 | 11/1997 | Lee | 437/69 |
| 5,688,710 | 11/1997 | Lu | 437/57 |
| 5,705,409 | 1/1998 | Witek | 437/35 |
| 5,726,476 | 3/1998 | Kim | 257/369 |
| 5,770,504 | 6/1998 | Brown et al. | 438/296 |
| 5,776,660 | 7/1998 | Hakey et al. | 430/296 |
| 5,861,330 | 1/1999 | Baker et al. | 438/232 |
| 5,895,253 | 4/1999 | Akram | 438/424 |
| 5,904,540 | 5/1999 | Sheng et al. | 438/427 |
| 5,904,541 | 5/1999 | Rho et al. | 438/433 |

OTHER PUBLICATIONS

IBM Technical Disclosure Bulletin, vol. 27, No. 4B, Sep. 1984, Scalable CMOS Technology With Enhanced Protection Against Latch–Up, T.C. Lo, pp. 2443–2445.

*Primary Examiner*—Tom Thomas
*Assistant Examiner*—Douglas W. Owens
*Attorney, Agent, or Firm*—Pollock, Vande Sande & Amernick

[57] ABSTRACT

A method and structure for improving the latch-up characteristic of semiconductor devices is provided. A dual depth STI is used to isolate the wells from each other. The trench has a first substantially horizontal surface at a first depth and a second substantially horizontal surface at a second depth which is deeper than the first depth. The n- and p-wells are formed on either side of the trench. A highly doped region is formed in the substrate underneath the second substantially horizontal surface of the trench. The highly doped region abuts both the first and the second wells and extends the isolation of the trench.

26 Claims, 13 Drawing Sheets

STRUCTURE FOR IMPROVED LATCH-UP USING DUAL DEPTH STI WITH IMPURITY IMPLANT

FIELD OF THE INVENTION

The present invention relates to an isolation method and structure used in semiconductor integrated circuits and more particularly to a dual depth shallow trench isolation (STI) structure with an impurity region formed under the trench.

BACKGROUND OF THE INVENTION

Semiconductor integrated circuits are becoming increasingly complex, yet there is a constant drive to decrease the size of the circuits. The drive to decrease the size and increase the density of these circuits can result in several problems which may cause circuit failures if they are not addressed. Latch-up is one problem which can occur frequently in densely packed devices if not properly addressed. Latch-up can be triggered by many mechanisms and can cause the circuit to fail. Latch-up is commonly caused by the close proximity of n-type and p-type devices in CMOS circuits, where the parasitic NPN bipolar transistors can be triggered into a low resistance holding state. This low resistance state can draw large currents which can be destructive.

STI is commonly used to isolate n-channel and p-channel devices in CMOS circuits. STI reduces the likelihood of latch-up, among other advantages. However, as semiconductor devices become smaller and more densely packed, certain features of the device also become smaller, while other features remain constant. For example, the n+ and p+ space, as well as the STI trench depth has scaled smaller, while EPI thickness has remained constant.

The EPI thickness needs to remain constant in order to accommodate retrograde wells. A retrograde well is one in which the surface doping is lower than the doping of the well deeper into the substrate, that is, the further in the substrate, the higher the doping concentration. Hence, a retrograde well requires a fairly thick EPI to accommodate the deeper retrograde wells.

The STI depth is required to be deep enough to adequately isolate devices. As the STI width is scaled smaller, higher aspect ratio trenches are formed that are is difficult to fill. When a trench with a high aspect ratio is filled, voids are often created in the fill which may cause a variety of problems. Additionally, as the size of the STI is reduced, latch-up immunity is decreased. Therefore, there is a need for an isolation structure which is easy to manufacture and which also improves the latch-up of densely packed semiconductor devices.

SUMMARY OF THE INVENTION

A structure and a method for improved latch-up using a dual depth STI with an impurity implant formed under the deep trench is provided. In one embodiment of the invention, a dual depth trench is formed in a substrate. The trench includes a first substantially horizontal surface at a first depth and a second substantially horizontal surface at a second depth which is deeper than the first depth. A first well having a first type dopant and a second well having a second type dopant are formed in the substrate so that both wells abut the trench. A doped region is formed in the substrate abutting both the first well and the second well. The doped region is formed below the second substantially horizontal surface of the trench in order to lower a beta product between the wells. The beta product is the product of the parasitic bipolar device gains (NPN and PNP betas).

In a further embodiment, well edge implants are formed in the first and second wells. The well edge implant formed in the first well is a highly doped area of the first conductivity type and the well edge implant in the second well is a highly doped area of the second conductivity type. The well edge implants are formed in their respective wells preferably adjacent to the deepest portion of the trench.

In one method for forming the dual depth trench, a substrate having at least one dielectric layer formed thereon and a resist layer deposited on the at least one dielectric layer is provided. The resist layer is patterned and a trench is formed through the dielectric into the substrate according to the patterned resist. A dopant is implanted into the substrate using the patterned resist layer as a mask to form a highly doped region in the substrate at a distance below the trench. The resist is stripped and another resist layer is deposited and patterned to provide a wider opening for the formation of a wide trench STI region. The newly exposed substrate and the existing trench are both etched until a bottom of the existing trench reaches the highly doped region, resulting in a dual depth trench. The dual depth trench is then filled with an oxide and wells of opposite conductivity types are implanted into the substrate on opposite sides of the trench.

In another method, a hybrid resist is used to form the trench and potentially the wells also. A hybrid resist may also be used to form the well edge implants adjacent to the trench.

DETAILED DESCRIPTION OF THE INVENTION

The present invention provides a structure and method for improved latch-up characteristics using dual depth STI with a highly doped region formed under the trench. The highly doped region is implanted through the trench, preferably before the trench is filled. The trench has at least two levels. The highly doped region makes the isolation of the trench effectively deeper.

The invention is preferably implemented in the context of conventional CMOS devices where n-channel and p-channel transistors are formed next to each other. The n-wells and p-wells formed next to each other are isolated by STI. The dual depth trench and highly doped region of the present invention are used to improve the latch-up performance.

Figure 1:
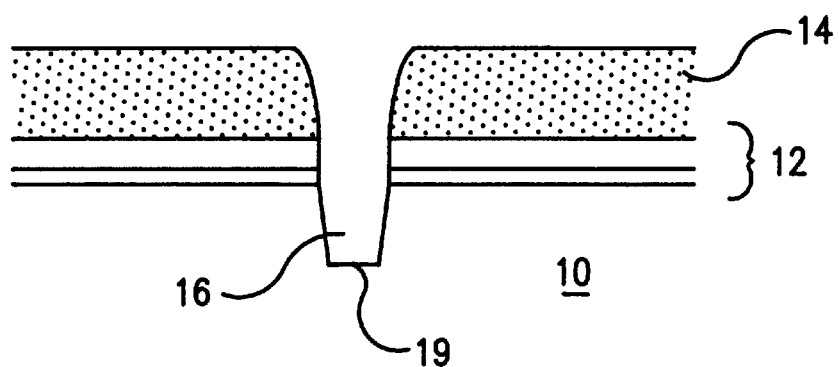
FIG. 1 is a cross-section of a wafer with a first trench.
Figure 2:
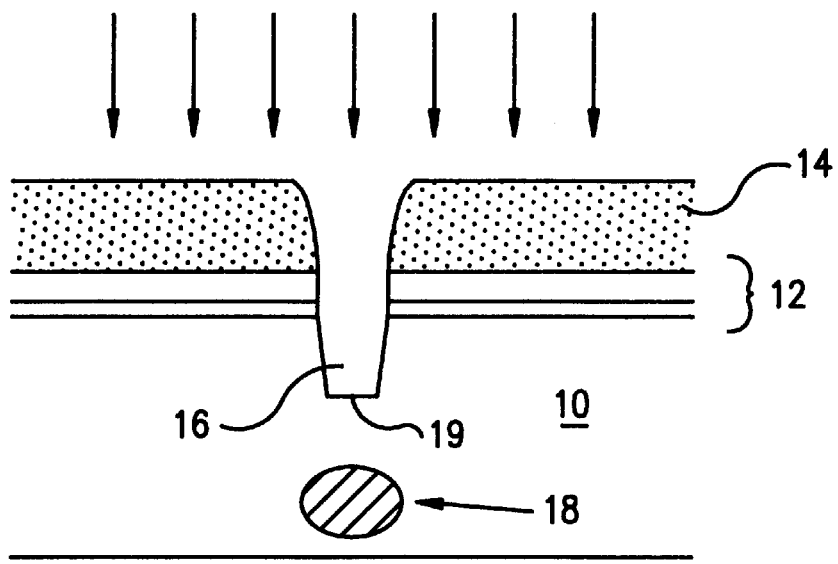
FIG. 2 is a cross-section of a wafer with a highly doped region formed under the first trench.

A first method of forming the structure of the present invention will now be described with reference to FIGS. 1–8. As shown in FIG. 1, an EPI substrate 10 with an insulating layer 12 and a resist 14 is provided on a wafer 1. The insulating layer 12 is shown as a dual layer film comprising a layer of silicon nitride on top of silicon dioxide, although other insulating layers, such as ONO, or no insulating layer may be used. The resist shown in FIG. 1 has already been patterned. The resist 14 is preferably patterned to form a ring around a region to be the p-well, at a boundary between the n-well and the p-well. The location of the resist opening can be adjusted to overlap more of the p-well or the n-well. As the boundary between the wells is essentially a line, the resist pattern is shaded into one of the wells. In this instance the resist is patterned to form a ring around the p-well. A first trench 16 is then formed, preferably by etching, through the insulating layer 12 and into the substrate 10 according to the patterned resist 14. The first trench 16 is preferably formed to a depth in the range of about 0.25 microns to 0.35 microns, typically about 0.3 microns, and is preferably kept very narrow, for example about 0.2 microns wide.

A dopant is then implanted into the substrate using the patterned resist layer 14 as a mask. The dopant is implanted below the first trench 16 and will preferably be self-aligned to the bottom of the first trench. Preferably, the dopant is implanted at an energy so that the peak of the highly doped region is about 0.75–0.85 microns, typically approximately 0.8 microns into the substrate 10. The dopant may either be n-type or p-type, depending on which well the trench has been formed in. If the first trench 16 has been formed at the edge of the p-well region, a p-type dopant is preferably used and if the trench is formed at the edge of the n-well region, an n-type dopant is preferably used. However, the dopant may also be a neutral implant. The resist is then removed and a second resist layer is deposited and exposed to form the pattern for a standard STI trench process.

Figure 3:
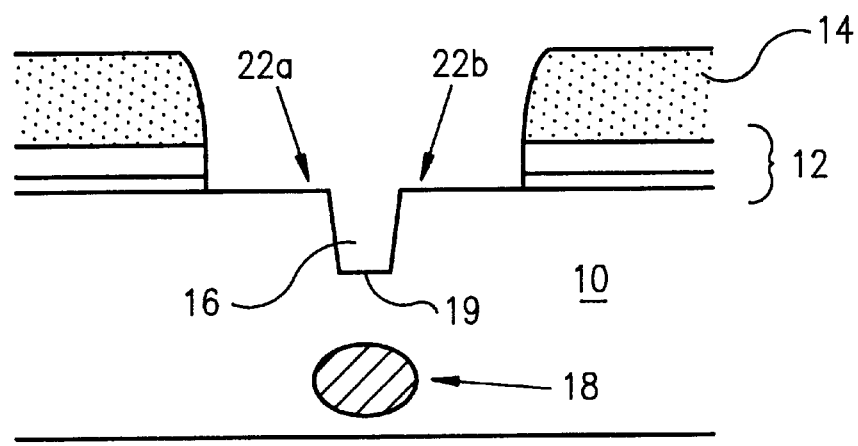
FIG. 3 is a cross-section of the wafer where the second trench resist layer has been exposed and the dielectric layers etched to expose the substrate.

As shown in FIG. 3, the insulating layers 12 are then etched to expose surfaces 22a and 22b adjacent to the first trench 16. The substrate surfaces 22a, 22b which have just been exposed, as well as the first trench, are then etched simultaneously until a bottom 19 of the first trench 16 reaches a depth near the peak of the doped region as shown for example, in FIG. 4. The STI region is preferably not self-aligned to the first trench. This etching process results in the dual depth trench structure.

Figure 4:
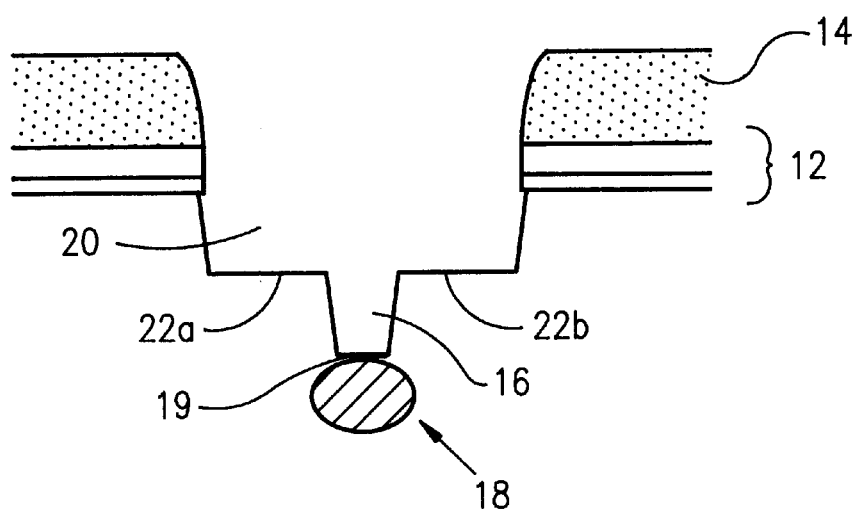
FIG. 4 is a cross-section of the wafer showing the dual depth STI.

As shown in FIG. 4, the dual depth trench has a first depth at which two substantially horizontal surfaces 22a,b are formed. These surfaces preferably have the depth and width of a typical STI region. The first trench 16 is formed in the bottom of STI 20. The first trench 16 has a substantially horizontal bottom surface 19 which is deeper than the first horizontal surfaces 22a,b. The bottom surface 19 preferably reaches a depth near the peak of the highly doped implant 18.

Figure 5:
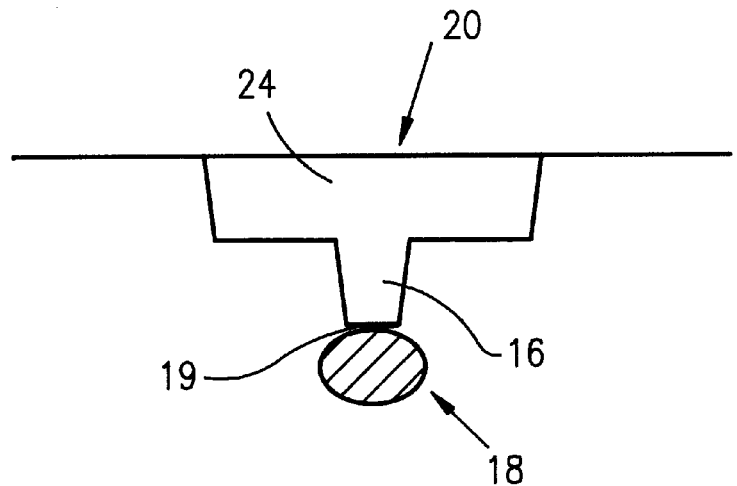
FIG. 5 is a cross-section of the wafer where the dual depth STI has been filled and planarized.
Figure 6:
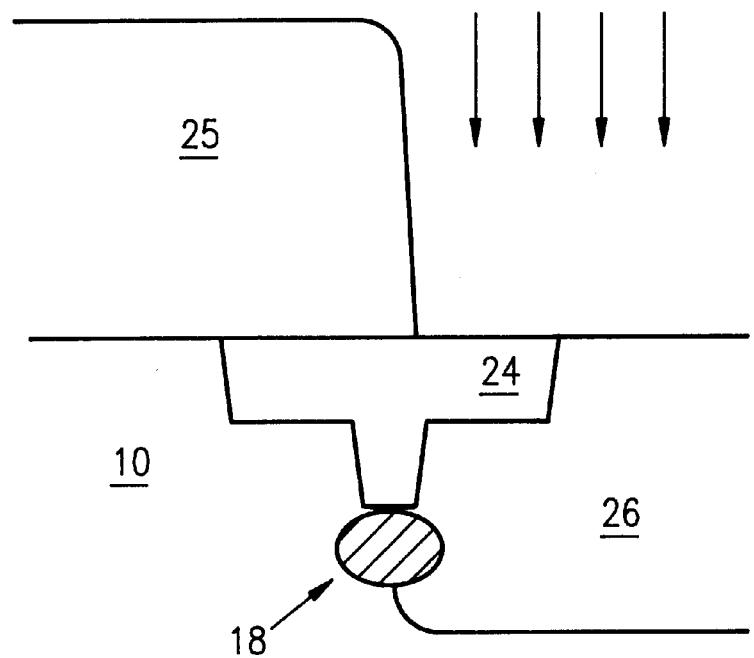
FIG. 6 is a cross-section of the wafer showing the implantation of the n-well.
Figure 7:
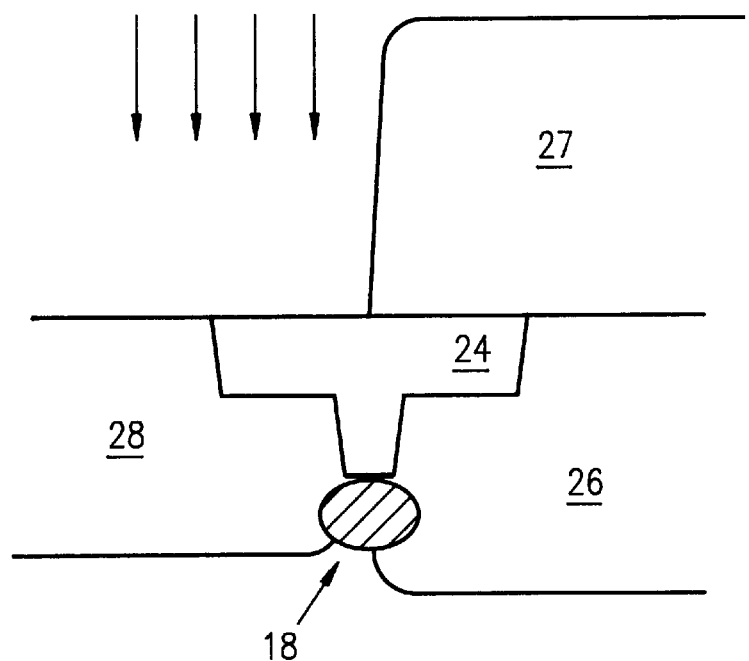
FIG. 7 is a cross-section of the wafer showing implantation of the p-well.

The resist 14 is then stripped and the entire dual depth trench structure 16, 20 is filled, preferably with oxide 24. The structure is then planarized preferably with CMP, and the insulating layers 12 are removed as shown in FIG. 5. Next, the wells may be formed in the substrate in a conventional manner. Resist 25 is applied and patterned for the implant to form the n-well 26 as shown in FIG. 6. As the highly doped region 18 in this embodiment is a p+ region, the n-well 26 should not be implanted over the entire p+ region 18. Preferably, the n-well 26 is slightly shifted off-center, to the right as shown in FIG. 6, so that the n-well 26 does not overlap and counter-dope the p+ region 18. N-type dopants are implanted to form the n-well 26. The resist 25 for the n-well 26 is then stripped and a resist 27 is applied and patterned to form the p-well 28. P-type dopants are then implanted to form the p-well 28 as shown in FIG. 7.

Figure 8:
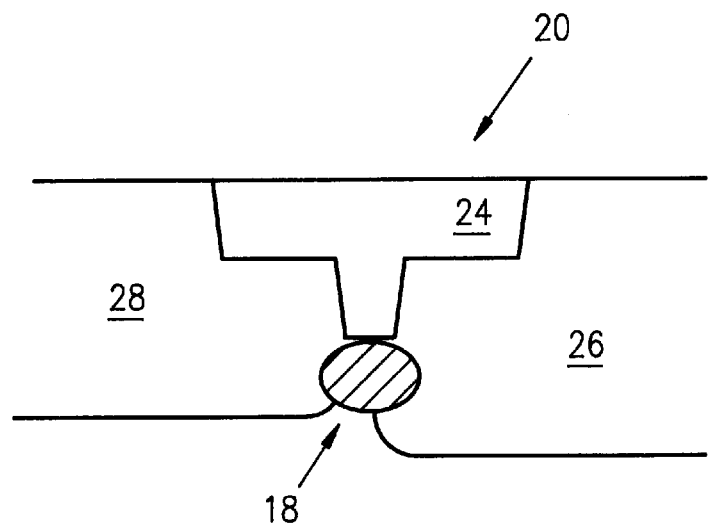
FIG. 8 is a cross-section of the completed dual depth STI structure.

The resist 27 is stripped resulting in the final structure as shown in FIG. 8. The highly doped region 18 is self-aligned to the bottom 19 of the first trench 16 at the edge of the p-well 28. The n-well 26 and the p-well 28 may be formed deeper than the dual depth trench 16, 20 and the highly doped region 18 for example, if retrograde wells are used. Also, the n-well 26 and the p-well 28 may contact each under the highly doped region 18. However, as discussed above, it is preferable that the n-well 26 be shifted slightly off-center in order to avoid counter-doping the highly doped region 18. Of course, if the highly doped region 18 were of n-type, it would be preferable that the p-well 28 be shifted slightly off-center, to the left as shown in FIG. 8, in order to avoid counter-doping the high doped region 18. The highly doped region 18 improves the isolation characteristics of the trench structure improving the latch-up performance of the device.

In an alternative embodiment, a hybrid resist is used to form the first trench at the well edge. A hybrid resist is one in which a difference in exposure energy changes the tone of the resist. Areas exposed with high intensity radiation form a negative tone line pattern and areas which are unexposed from a positive tone line pattern. Areas exposed with intermediate amounts of radiation make the resist soluble during developing. The dissolution rates of the resist result in the unexposed resist not developing, the partially exposed resist developing at a higher rate, and the highly exposed resist not developing. This dissolution response of the hybrid resist allow a single aerial image to be printed as a space/line/space combination rather than as a single line or space as is the case with conventional resist.

In order to form the first trench using hybrid resist, the hybrid resist is deposited across the surface of the substrate. The hybrid resist is then exposed to actinic radiation with the areas which are to be p-wells blocked with suitable mask shapes. The resist is then developed and hybrid resist portions which are unexposed, i.e., the p-well regions, remain insoluble and form positive tone line patterns. Hybrid resist portions which are exposed with high intensity radiation, i.e., the non p-well regions, form a negative tone line. Hybrid resist portions which are exposed with intermediate amounts of intensity, i.e., the edges of the p-well regions, are dissolved during the development step. Different type of hybrid resists which may be used are described in copending U.S. patent application Ser. No. 08/715,287 which is incorporated herein by reference.

Figure 9:
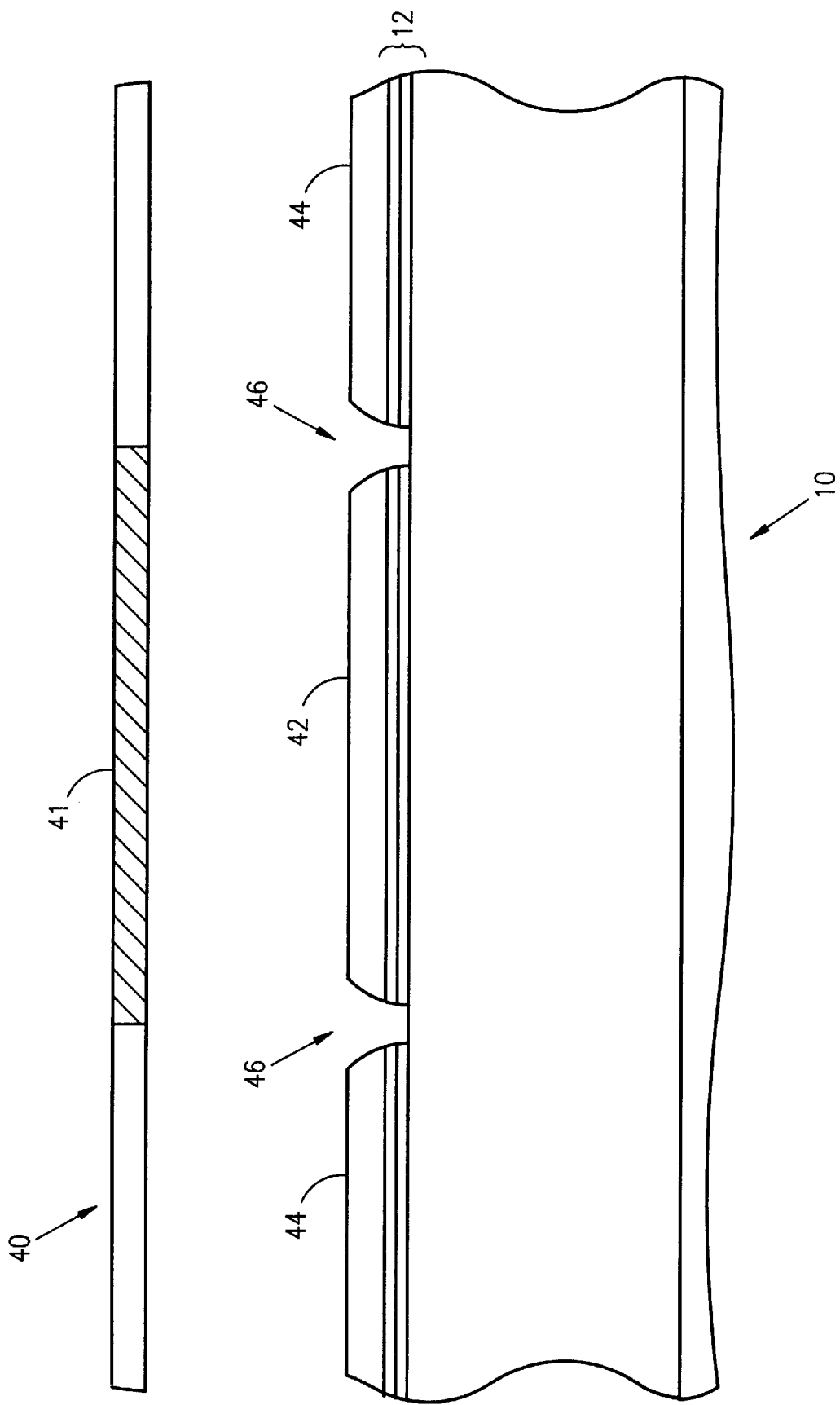
FIG. 9 is a cross-sectional view of a wafer overlaid with hybrid resist and a mask used to pattern the resist to form the first trench.
Figure 10:
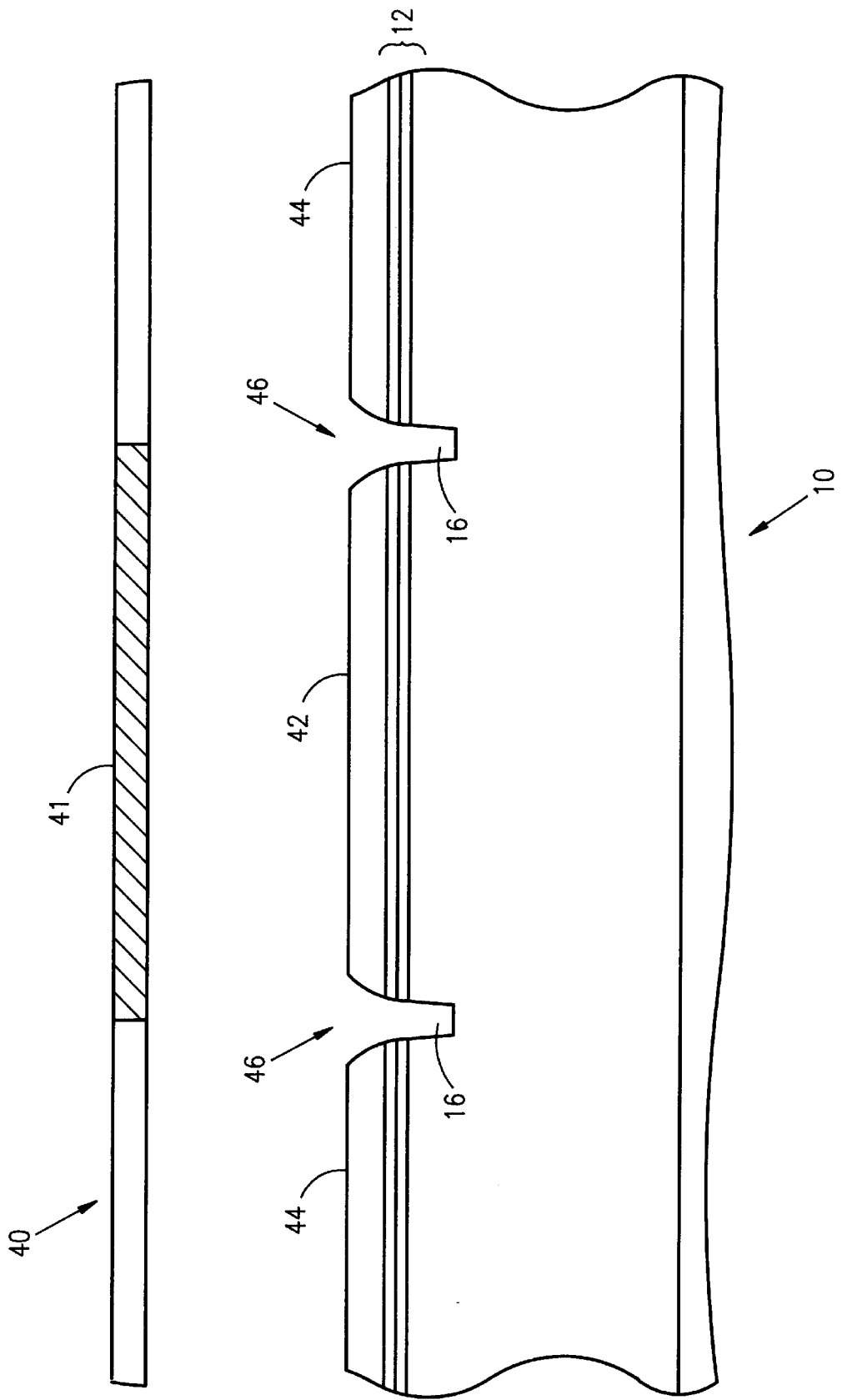
FIG. 10 is a cross-section of the wafer showing the first trench formed using the hybrid resist as a pattern.

Turning to FIG. 9, the wafer 10 is illustrated with hybrid resist deposited across the surface that has been exposed and developed. A chrome region 41 in mask 40 blocks the p-well regions during actinic radiation exposure. Thus, the portions of the hybrid resist over the p-well regions are unexposed and hybrid resist portions over non p-well regions are highly exposed, with areas of intermediate exposure in between. After development, a positive tone line pattern 42 is formed above the p-well region and negative tone line patterns 44 are formed above the non-p-well regions. Hybrid resist portions that were exposed to intermediate amounts of radiation are dissolved during developing, forming well edge spaces 46 at the edges of the p-well regions. Because of the unique properties of hybrid photo resist, the well edge spaces 46 can be formed with dimensions of 0.2 microns or less using lithography tools that are designed for operation at 0.35 micron resolution. The first trench 16 is formed in the substrate 10, preferably by etching, using the hybrid resist as a mask, as shown in FIG. 10. The highly doped region is then implanted using the hybrid resist as a mask and the process continues as described above.

Figure 11:
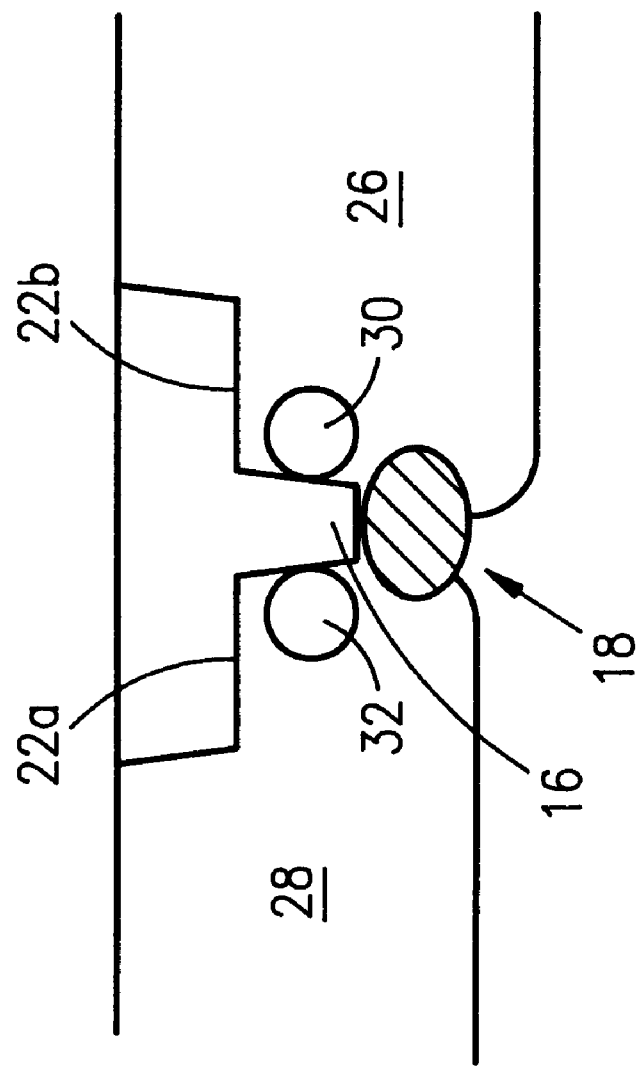
FIG. 11 is a cross-section of the dual depth STI structure including well edge implants.

Alternatively, hybrid resist can also be used to form the well implants, as well as to form additional highly doped regions next to trench i.e. well edge implants. The well edge implants may be provided in the wells as shown in FIG. 11. Here, a p+ well edge implant 32 and an n+ well edge implant 30 are formed on either side of the first trench 16, preferably underneath the second substantially horizontal surfaces 22a, b. A method of using hybrid resist to form the well implants, as well as the well edge implants will now be described with reference to FIGS. 12–17.

In step 202, the dual depth STI 16, 20 and highly doped region 18 are formed in one of the ways described above. Hybrid resist is deposited on the substrate, exposed and developed per step 204. The resist is preferably patterned so well edge spaces 52 are formed above the surfaces 22a,b of the dual depth trench as shown in FIG. 13.

The next step 206 is to form p-well edge implants through the well edge spaces. In this embodiment, the p-well edge implants preferably comprise a p+ region around the edges of the p-well. The implants are preferably formed by implanting boron or other p+ donor species through the well edge shapes. The amount of implant is selected to reduce minority carrier life times, but should be done at a low enough dose so as not to destroy the photo-active compound in the hybrid resistance.

Figure 12:
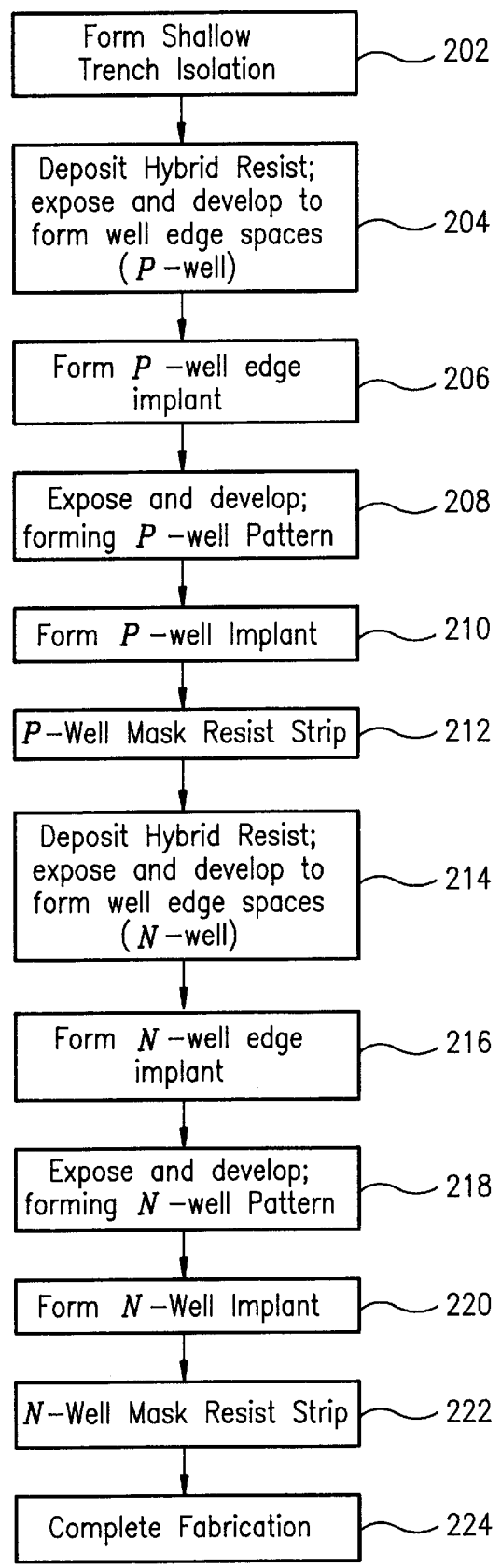
FIG. 12 is a schematic flow diagram representing a fabrication method for forming the well edge implants and the well implants using a hybrid resist.
Figure 13:
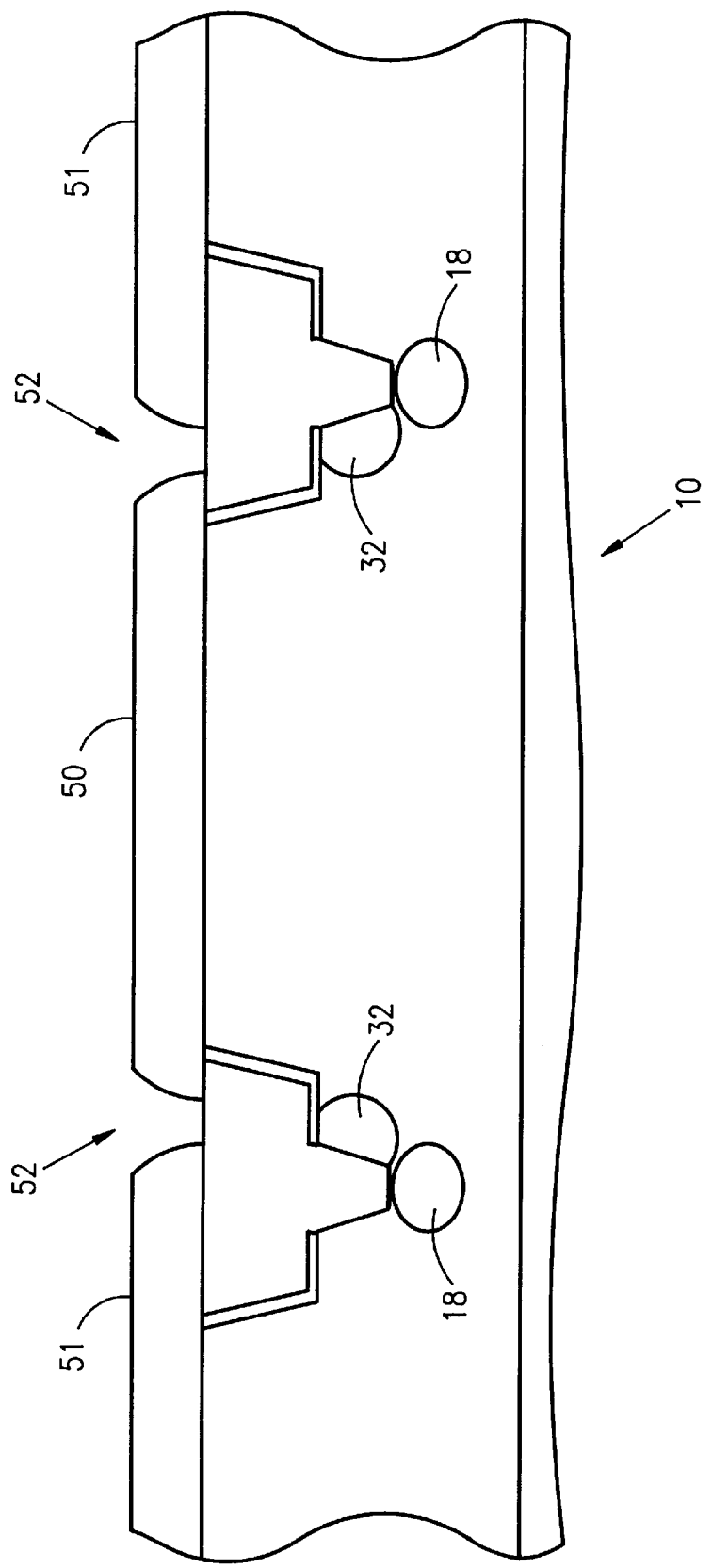
FIG. 13 is a cross-sectional view of a wafer with p-well edge implants formed.

Turning to FIG. 13, the wafer 10 is illustrated with p-well edge implants 32 formed. Returning to the method shown in FIG. 12, the next step 208 is to expose and develop the p-well regions of the hybrid resist 50. Because the hybrid resist portion 50 above the p-well regions were unexposed during actinic radiation exposure of step 204, those portions comprise positive tone pattern. Thus, the hybrid resist portions 50 above the p-well regions can be removed by blanket exposing the wafer portion and developing away the positive tone pattern. Thus, this removal can be done without requiring additional masking layers or masking steps.

Figure 14:
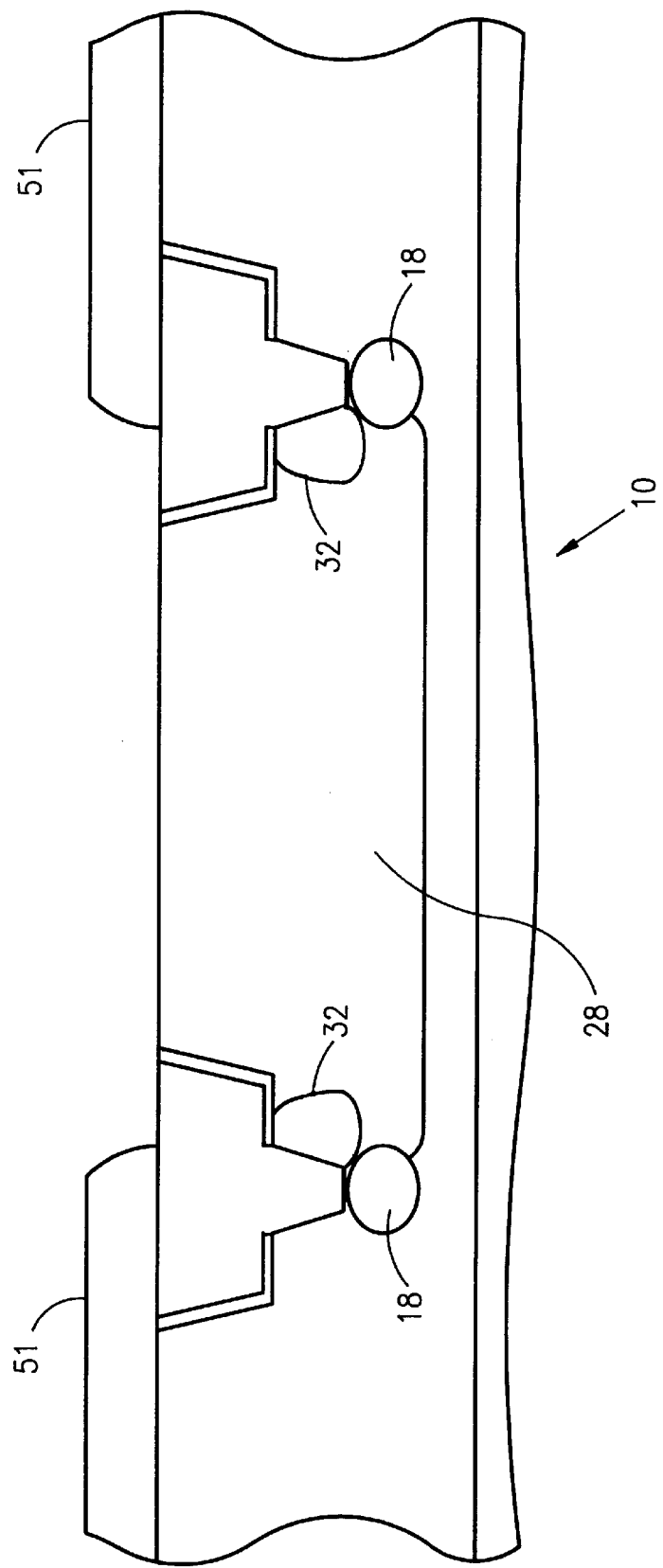
FIG. 14 is a cross-sectional view of a wafer portion with p-well edge implants and the p-well formed.

At the next step 210, p-wells are formed using any suitable p-type implant technique. Turning to FIG. 14, the wafer portion 10 is illustrated with the positive tone portion 50 of the hybrid resist removed and a p-well 28 implanted into substrate. The remaining negative tone portions 51 serve to block off the non-p-well regions from receiving the p-type implant. Because the p-well edge implants 32 share the same positive tone resist structures as the p-well 28, they are self aligned to each other. With the p-wells formed, the next step 212 is to strip the remaining portions (i.e., the negative tone portions 51) of the hybrid resist.

With the p-wells and the p-well edge implants formed, the steps 214 through 222 form the n-wells and the n-well edge implants. At step 214, well edge spaces 57 are formed at the n-well edges using the hybrid resist properties.

Again, hybrid resist is first deposited across the surface of the wafer. The hybrid resist is then exposed to actinic radiation with the areas which are to be n-wells blocked with suitable mask shapes (i.e., chrome mask shapes). The hybrid resist is then developed. Hybrid resist portions which are unexposed (i.e., the n-well regions) remain insoluble in developer and form a positive tone line pattern. Hybrid resist portions which are exposed with high intensity radiation (i.e., the non-n-well regions) form a negative tone line image. Hybrid resist portions which are exposed with intermediate amounts of intensity (i.e., the edges of the n-well regions) are dissolved during the development step.

Figure 15:
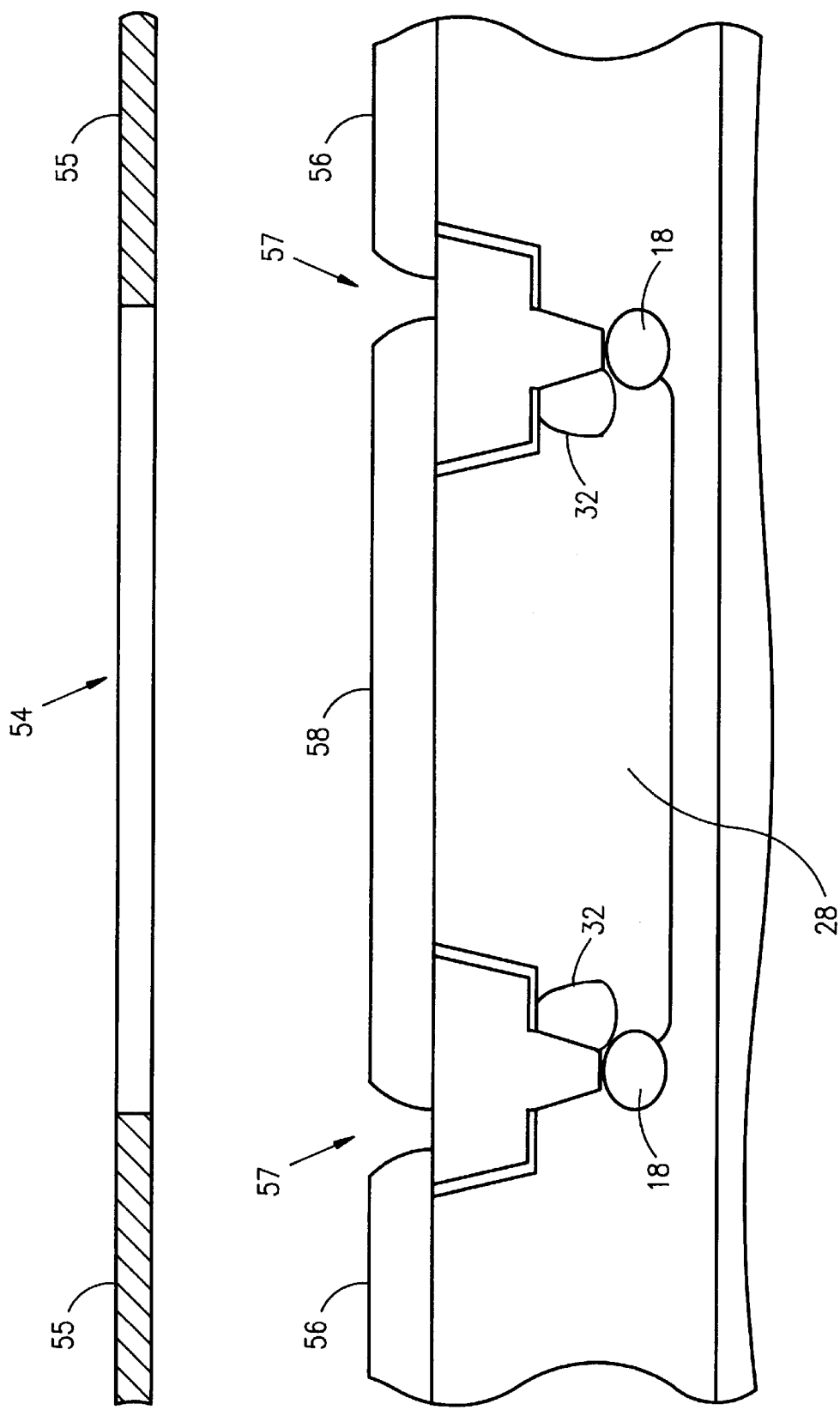
FIG. 15 is a cross-sectional view of a wafer portion overlaid with hybrid resist and a mask used to pattern the resist for n-well edge implant formation and n-well formation.

Turning to FIG. 15, the wafer 10 is illustrated with hybrid resist deposited across the surface that has been exposed and developed. Chrome regions 55 in the mask 54 block the n-well regions during actinic radiation exposure. Thus, the n-well regions are unexposed and non-n-well regions are highly exposed, with areas of intermediate exposure in between. After development, positive tone line patterns 56 are formed above the n-well regions and a negative tone line pattern 58 is formed above the non-n-well regions. Hybrid resist portions that were exposed to intermediate amounts of radiation are dissolved during developing, namely, well-region edge spaces 57 at the edges of the n-well regions. Again, because of the unique properties of hybrid photo resist, the well-edge spaces can be with dimensions of 0.2 microns or less using lithography tools that are designed for operation at 0.35 micron resolution.

Returning to the method illustrated in FIG. 12, the next step 216 is to form n-well edge implants through well edge spaces 57. The n-well edge implants preferably comprise a n+ region around the edges of the n-well. The implants are preferably formed by implanting phosphorous (or other donor species such as arsenic (As) or antimony (Sb)) through the well edge spaces. Again, the amount of implant is selected to reduce minority carrier lifetimes, but should be done at a low enough dose so as not to destroy the photo-active compound in the hybrid resist. As such, the preferred implant is phosphorous and suitably implanted to a depth greater than the STI trench depth. The preferred dose is about 1E11 to 1E15 ions/sq-cm and the most preferred dose is about 1E13 ions/sq-cm.

Figure 16:
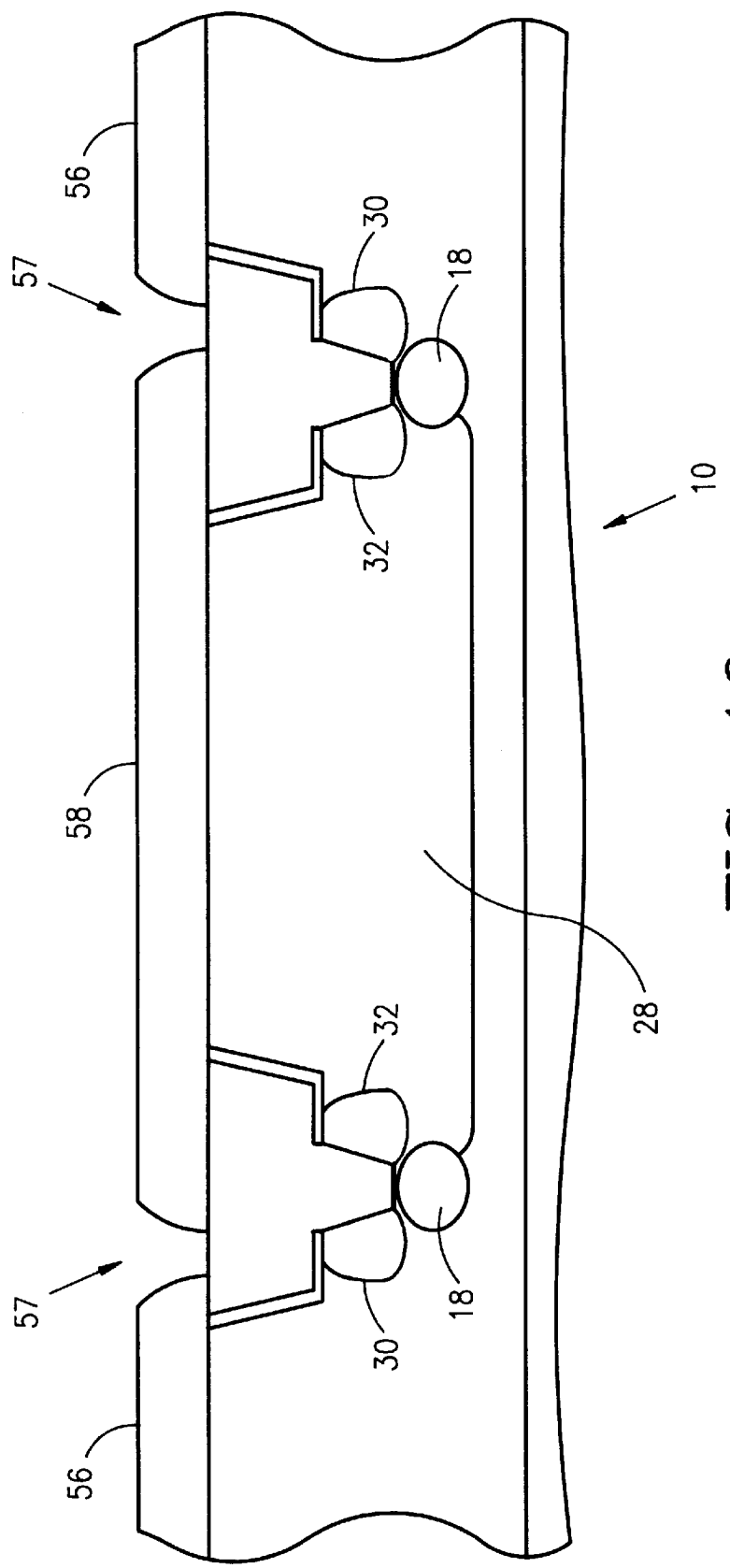
FIG. 16 is a cross-sectional view of a wafer portion with n-well edge implants.

Turning to FIG. 16, the wafer portion 10 is illustrated with n-well edge implants 30 formed. Returning to the method 2000, the next step is to expose and develop the n-well regions of the hybrid resist. Because the hybrid resist portion above the n-well regions were unexposed, they comprise positive tone patterns. Thus, the hybrid resist portions above the n-well regions can be removed without requiring additional masking steps by blanket exposing the wafer and developing away the positive tone patterns.

Figure 17:
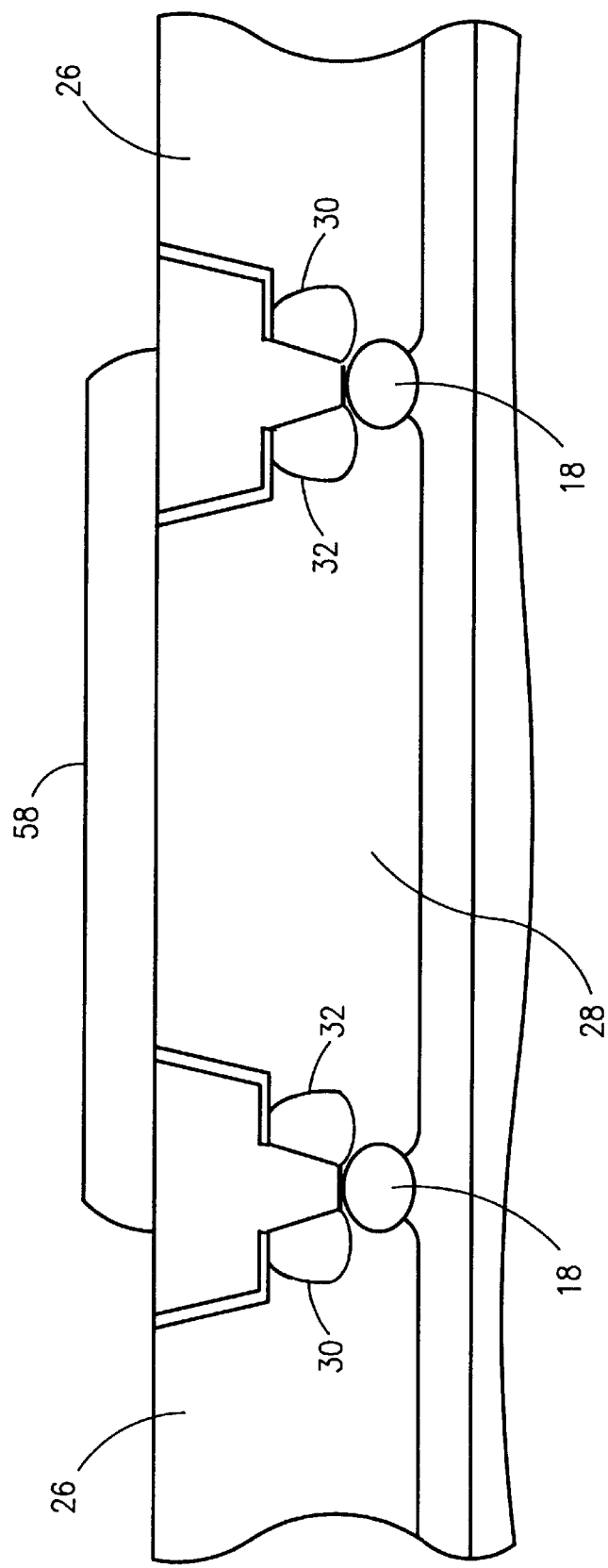
FIG. 17 is a cross-sectional view of a wafer portion with n-well edge implants and the n-well formed.

At the next step 220, n-wells are formed using any suitable n-type implant technique. In FIG. 17, the wafer portion 10 is illustrated with the positive tone portions 56 of the hybrid resist removed and n-wells 26 implanted into the substrate. The remaining negative tone portion 58 serves to mask off the non-n-well regions from receiving the n-type implant. Because the n-well edge implants 30 share the same positive tone resist structures as the n-well 26, they are self aligned with each other.

In the next step 222 (FIG. 12), the remaining portions (i.e., the negative tone portions 58) of the hybrid resist are stripped. The wafer 10 can then be completed using suitable fabrication techniques, i.e., forming the device gates and the contact diffusion regions.

Thus the embodiment illustrated in FIGS. 12–17 provides a method and structure for reducing latch-up in CMOS devices by forming N+ and/or P+ edge implants at the edge of the P-wells, N-wells and/or twin-wells. Of course, the conductivity types and the order of implantation could be reversed. Alternative methods of forming the well edge implants are described in U.S. Pat. No. 5,861,330 to Baker et al. which is incorporated herein by reference. Of course, the above described method could be modified to use hybrid resist to form any of the trench, wells, or well edge implants individually or in combination.

Accordingly, a structure and method for improved latch-up using dual depth STI with a highly doped region formed under the deep trench and alternative well edge implants has been provided. The highly doped region formed under the deep trench effectively extends the depth of the isolation by decreasing the beta product of the parasitic bipolar devices. The dual depth structure results in low aspect ratios for both depths of the trench and avoids the problems of filling trenches with high aspect ratios, as well as overcoming other problems associated with the prior art.

While a preferred embodiment of the invention has been described above, since variations in the invention will be apparent to those skilled in the art, the invention should not be construed as limited to the specific embodiments described above. For example, although the structure and method were described above for an EPI wafer, any substitute could be used.

We claim:

1. A device comprising:
   a substrate having a horizontal top surface;
   a dual depth trench in said substrate including a first substantially horizontal surface at a first depth and a second substantially horizontal surface at a second depth deeper than said first depth;
   a first well having a first type dopant and a second well having a second type dopant both abutting said dual depth trench;
   a doped region in said substrate abutting both said first well and said second well and below said second substantially horizontal surface; and
   a well edge implant formed in each of said wells next to said trench at a depth deeper than said first depth, and wherein each said well edge implant is of the same conductivity type as its respective well.

2. The device of claim 1 wherein said doped region lowers a beta product between said wells.

3. The device according to claim 1 wherein said well edge implant is the same conductivity type as its respective well.

4. A semiconductor device comprising:
   a first well of a first conductivity type and a second well of a second conductivity type formed in a substrate;
   a trench having at least two levels, formed in said substrate to abut both said first and second wells, a first level of said trench having at least one first substantially horizontal surface at a first depth and a second level of said trench having a second substantially horizontal surface at a second depth which is deeper than said first depth;
   well edge implants formed adjacent to said trench in said first and second wells, only at a depth deeper than said first depth; and
   a doped region formed in said substrate under said second substantially horizontal surface.

5. The device of claim 4 wherein said doped region abuts both said first and second wells.

6. The device of claim 4 wherein said first and second wells are formed deeper in said substrate than said trench.

7. The device of claim 4 wherein said first well and said second well extend laterally under said doped region.

8. The device of claim 7 wherein said first well extends under a minority of said doped region.

9. The device of claim 4 wherein said doped region is self-aligned with sides of said trench at said second level.

10. The device of claim 4 wherein said trench is filled with oxide.

11. The device of claim 4 wherein said well edge implants are highly doped areas of the same conductivity type as their respective wells.

12. The device of claim 4 wherein said first substantially horizontal surface extends into both said first and said second wells and said well edge implants are formed in said wells under said first substantially horizontal surface.

13. A semiconductor device comprising:
   a first well of a first conductivity type and a second well of a second conductivity type formed in a substrate;
   a trench, having at least two levels, formed in said substrate to abut both said first and second wells, a first level of said trench having at least one first substantially horizontal surface at a first depth and a second level of said trench having a second substantially horizontal surface at a second depth which is deeper than said first depth;
   well edge implants formed adjacent to said trench in said first and second wells, wherein said first substantially horizontal surface extends into both said first and second wells and said well edge implants are formed in said first and second wells only under said first substantially horizontal surface; and
   a doped region formed in said substrate under said second substantially horizontal surface.

14. The device of claim 13 wherein said doped region abuts both said first and second wells.

15. The device of claim 13 wherein said first and second wells are formed deeper in said substrate than said trench.

16. The device of claim 13 wherein said first well and said second well extend laterally under said doped region.

17. The device of claim 16 wherein said first well extends under a minority of said doped region.

18. The device of claim 13 wherein said doped region is self-aligned with sides of said trench at said second level.

19. The device of claim 13 wherein said trench is filled with oxide.

20. A device comprising:
   a substrate having a horizontal top surface;
   a dual depth trench in said substrate including a first substantially horizontal surface at a first depth and a second substantially horizontal surface at a second depth deeper than said first depth;
   a first well having a first type dopant and a second well having a second type dopant both abutting said trench;

a doped region in said substrate abutting both said first well and said second well and below said second substantially horizontal surface; and a well-edge implant formed in each of said wells next to said trench at a depth deeper than said first depth, said well-edge implants being of opposite conductivity types.

21. The device of claim 20 wherein said doped region abuts both said first and second wells.

22. The device of claim 20 wherein said first and second wells are formed deeper in said substrate than said trench.

23. The device of claim 20 wherein said first well and said second well extend laterally under said doped region.

24. The device of claim 23 wherein said first well extends under a minority of said doped region.

25. The device of claim 20 wherein said doped region is self-aligned with sides of said trench at said second level.

26. The device of claim 20 wherein said trench is filled with oxide.

* * * * *